United States Patent
Meng et al.

(10) Patent No.: US 8,729,910 B2
(45) Date of Patent: May 20, 2014

(54) CAPACITANCE TOUCH PANEL MODULE AND FABRICATION METHOD THEREOF

(75) Inventors: Kai Meng, Shenzhen (CN); Lien-Hsin Lee, Miao-Li County (TW)

(73) Assignees: Innocom Technology (Shenzhen) Co., Ltd., Shenzhen (CN); Chimei Innolux Corporation, Miaoli County (TW)

(*) Notice: Subject to any disclaimer, the term of this patent is extended or adjusted under 35 U.S.C. 154(b) by 1039 days.

(21) Appl. No.: 12/718,068

(22) Filed: Mar. 5, 2010

(65) Prior Publication Data

US 2011/0069033 A1    Mar. 24, 2011

(51) Int. Cl.
*G01R 27/26*    (2006.01)

(52) U.S. Cl.
USPC ............................................ 324/658; 345/173

(58) Field of Classification Search
None
See application file for complete search history.

(56) References Cited

U.S. PATENT DOCUMENTS

| | | | |
|---|---|---|---|
| 2005/0030048 A1* | 2/2005 | Bolender et al. | 324/661 |
| 2006/0088698 A1* | 4/2006 | Majumdar et al. | 428/195.1 |
| 2008/0264699 A1* | 10/2008 | Chang et al. | 178/18.01 |
| 2009/0160817 A1 | 6/2009 | Wu et al. | |

* cited by examiner

*Primary Examiner* — Minh N Tang
(74) *Attorney, Agent, or Firm* — WPAT, PC; Justin King

(57) ABSTRACT

The invention discloses a method of fabricating a capacitance touch panel module. The method includes providing a substrate with a touching area and a peripheral area; forming a plurality of first conductive patterns on the substrate along a first orientation, a plurality of second conductive patterns along a second orientation, and a plurality of connecting portions in the touching area; forming a plurality of insulated protrusions, in which each insulated protrusion covers one connecting portion; forming an insulated frame on the peripheral area; and forming a bridging member on each insulated protrusion.

14 Claims, 9 Drawing Sheets providing a substrate comprising a touching area and a peripheral area around the touching area — S101 forming a plurality of first conductive patterns, a plurality of second conductive patterns, and a plurality of connecting portions; the first conductive patterns arranged in a plurality of rows along a first orientation, the second conductive patterns arranged between neighboring rows of the first conductive patterns, wherein each connecting portion connects two neighboring first conductive patterns arranged in a row, and the first conductive patterns are electrically insulated from the second conductive patterns — S103 forming a plurality of insulated protrusions in the touching area and an insulated frame in the peripheral area, wherein each insulated protrusion covers one connecting portion — S105 forming a bridging member on each insulated protrusion, the bridging member electrically connecting two neighboring second conductive patterns — S107 providing a substrate comprising a touching area and a peripheral area around the touching area — S101 forming a plurality of first conductive patterns, a plurality of second conductive patterns, and a plurality of connecting portions; the first conductive patterns arranged in a plurality of rows along a first orientation, the second conductive patterns arranged between neighboring rows of the first conductive patterns, wherein each connecting portion connects two neighboring first conductive patterns arranged in a row, and the first conductive patterns are electrically insulated from the second conductive patterns — S103 forming a plurality of insulated protrusions in the touching area and an insulated frame in the peripheral area, wherein each insulated protrusion covers one connecting portion — S105 forming a bridging member on each insulated protrusion, the bridging member electrically connecting two neighboring second conductive patterns — S107

FIG. 1

CAPACITANCE TOUCH PANEL MODULE AND FABRICATION METHOD THEREOF

BACKGROUND

1. Technical Field

The present disclosure generally relates to capacitance touch panel modules, and particularly, to a capacitance touch panel module and a fabrication method thereof.

2. Description of Related Art

Capacitance touch panels are often used in portable electronic devices due to their dustproof, multi-touch capabilities, and thermostable properties.

A commonly used capacitance touch panel module includes a touch panel and a cover lens bonded thereto by using optical adhesive. The touch panel includes a base plate, two transparent conductive layers, and two insulating layers. The conventional touch panel module having five layers, in combination with a possibly-added cover lens, results in an overly thick unit having lesser than optimum light transmittance, and reduced quality. In addition, the optical adhesive is expensive and cannot be recycled.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views, and all the views are schematic.

FIGS. 1 through 5 show a first embodiment of a method of fabricating a capacitance touch panel module.

DETAILED DESCRIPTION

Figure 2:
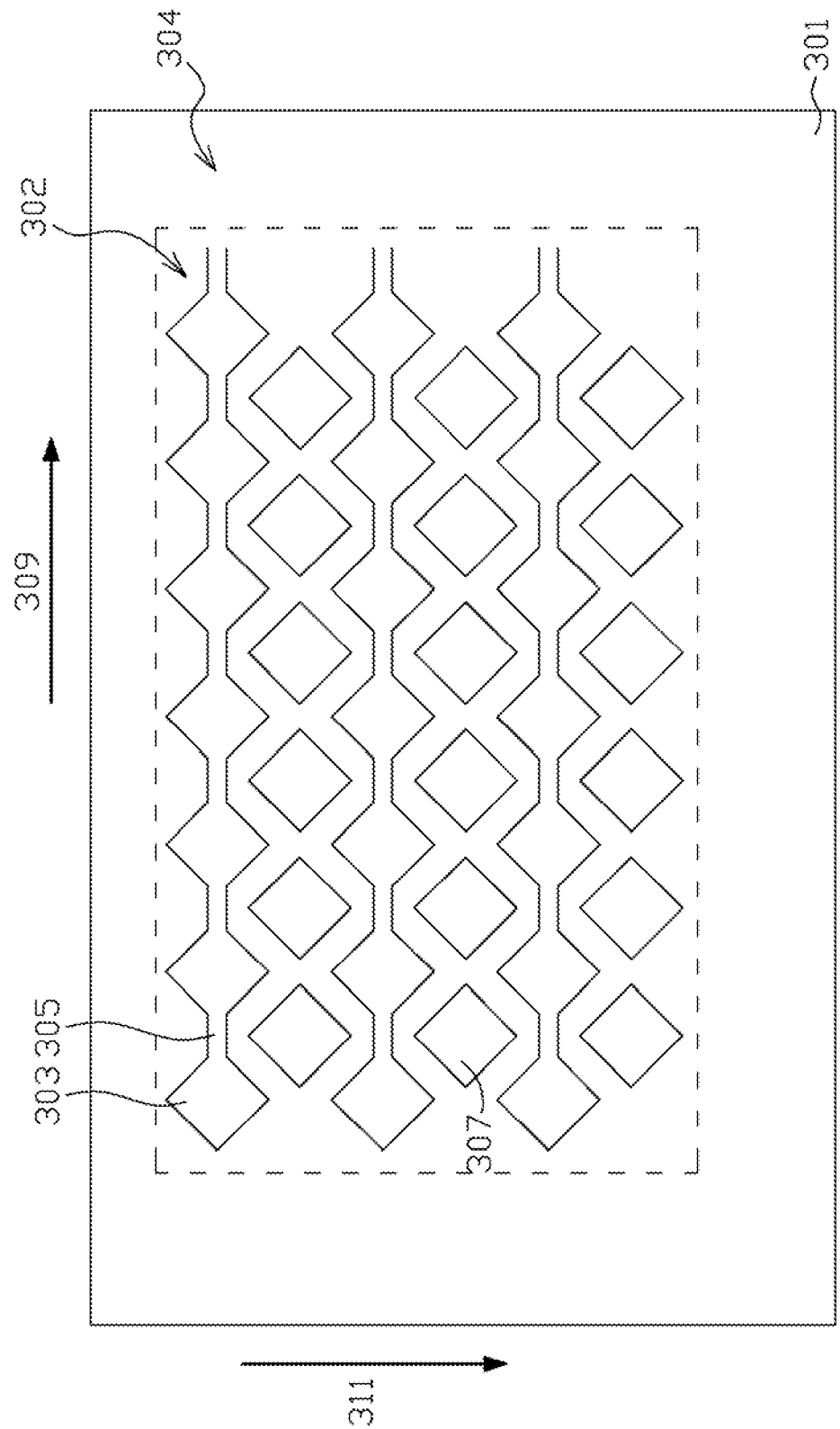

Referring to FIGS. 1 and 2, a first embodiment of a method of fabricating a capacitance touch panel module is described as follows. A substrate 301 with a touching area 302 and a peripheral area 304 arranged around the touching area 302 is provided. The substrate 301 may be made of glass, quartz, plastic, resin, acrylic fabric, or other transparent material.

A transparent conductive layer (not shown) is formed on the substrate 301 of indium tin oxide (ITO), indium zinc oxide (IZO), aluminum zinc oxide (AZO), gallium zinc oxide (GZO), magnesium indium oxide (MIO), or other transparent conductive materials. The transparent conductive layer is etched to form a plurality of first conductive patterns 303, a plurality of second conductive patterns 307, and a plurality of connecting portions 305 in the touching area 302. The first conductive patterns 303 are arranged in a plurality of rows along a first orientation 309. The second conductive patterns 307 are arranged between the neighboring rows of the first conductive patterns 303. Each connecting portion 305 connects two neighboring first conductive patterns 303 which are arranged in a row. The first conductive patterns 303 are electrically insulated from the second conductive patterns 307.

Figure 3:
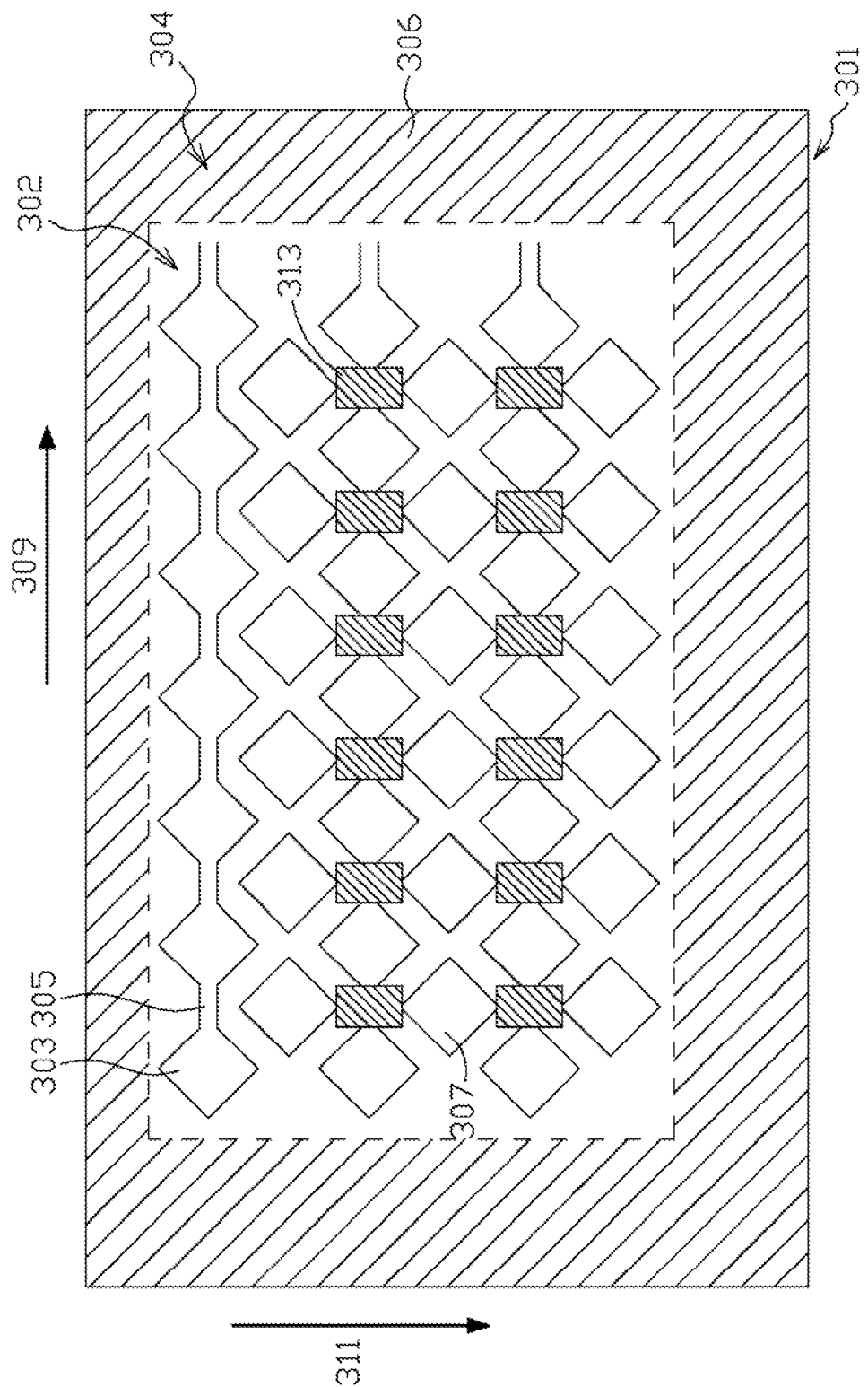

Referring to FIG. 3, a photoresist layer (not shown) or similar types of photosensitive insulating layer is formed on the substrate 301 and undergoes lithography to form a plurality of insulated protrusions 313 in the touching area 302 and forms an insulated frame 306 covering the peripheral area 304. Each insulated protrusion 313 covers one connecting portion 305 and at least part of the first conductive pattern 303 connecting with the connecting portion 305. The insulated protrusions 313 and the insulated frame 306 may be made of light absorption material to obtain a shading effect.

The insulated protrusions 313 and the insulated frame 306 may also be photo etched. In detail, an insulated layer may be formed on the substrate 301, followed by a photoresist layer formed on the insulated layer, and the photoresist layer may be formed by lithography, after which the insulated layer may be etched through the developed photoresist layer to form the insulated protrusions 313 and the insulated frame 306. Alternatively, the insulated protrusions 313 and the insulated frame 306 may be formed by ink jet printing.

The method may also include baking for about one hour at 200° C. to 300° C., preferably at 220° C. The surface of each insulated protrusion 313 becomes curved after baking due to cohesion of the insulated protrusions 313.

Figure 4:
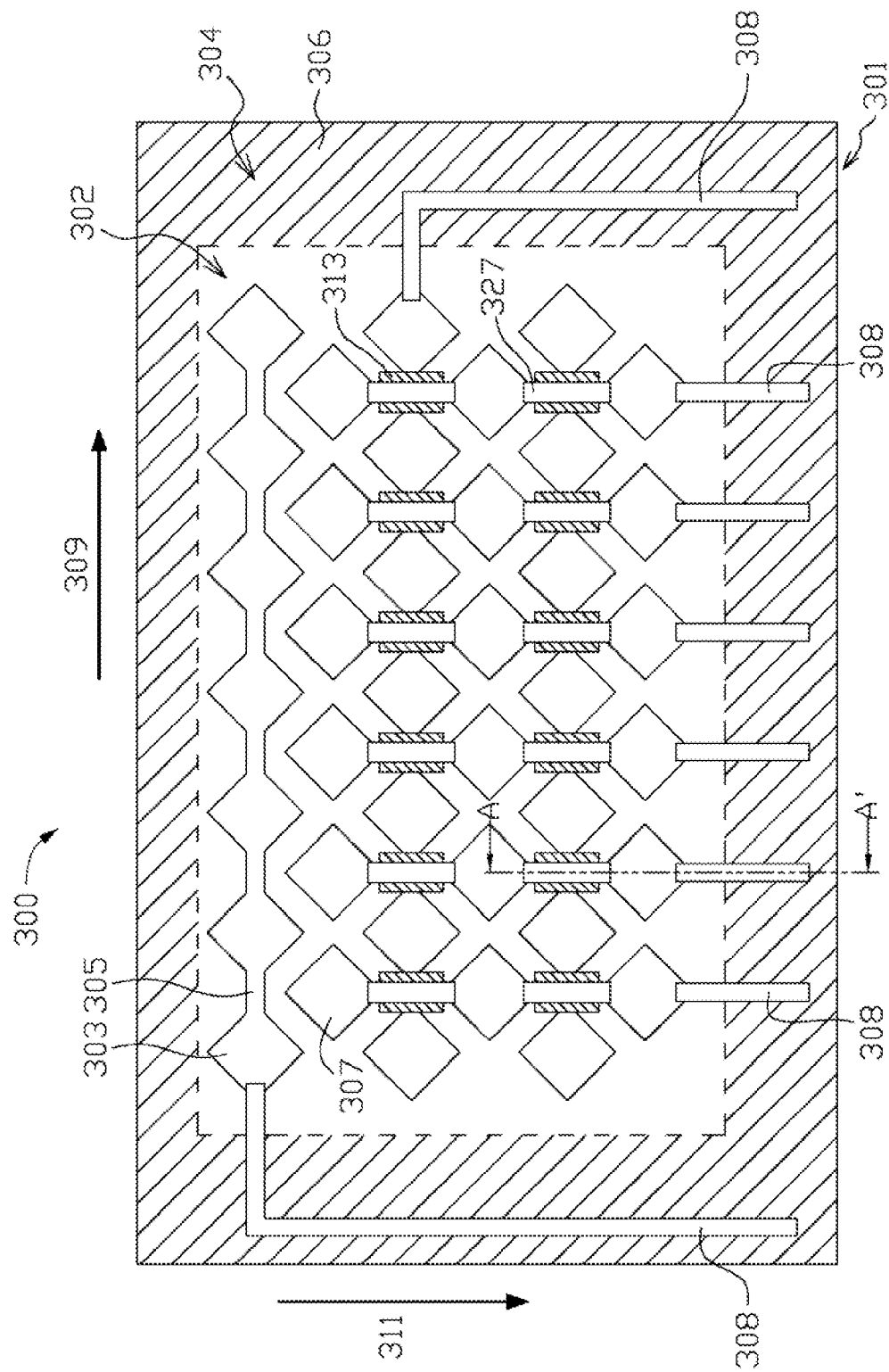

Referring to FIG. 4, a metallic layer (not shown) is deposited on the substrate 301, with a plurality of bridging members 327 formed in the touching area 302 and a plurality of conductive wires 308 formed in the insulated frame 306. Each bridging member 327 covers one insulated protrusion 313 and electrically connects two neighboring second conductive patterns 307 along a second orientation 311. Parts of the conductive wires 308 connect with parts of the first conductive patterns 303, respectively. The other parts of the conductive wires 308 connect with parts of the second conductive patterns 307.

Figure 5:
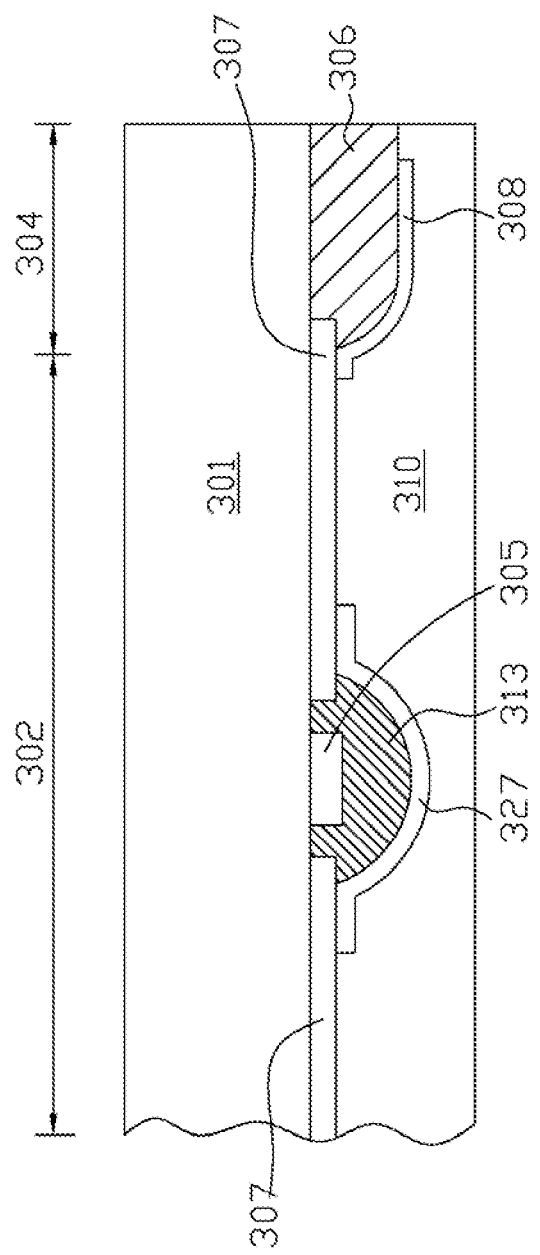

Referring to FIG. 5, a protective layer 310 is formed on the substrate 301 covering the entire touching area 302 and the entire peripheral area 304 to protect the contact structure (not labeled) and the conductive wires 308. The contact structure includes the first conductive patterns 303, the second conductive patterns 307, the bridging members 327, the insulated protrusions 313, and the connecting portions 305. The protective layer 310 may be silicon oxide, silicon nitride, or other materials.

Referring to FIGS. 1 through 5, the first embodiment of the method of fabricating a capacitance touch panel module is described in the following: in step S101, a substrate 301 comprising a touching area 302 and a peripheral area 304 around the touching area 302 is provided; in step S103, a plurality of first conductive patterns 303, a plurality of second conductive patterns 307, and a plurality of connecting portions 305 is formed, in which the first conductive patterns 303 are arranged in a plurality of rows along a first orientation 309, the second conductive patterns 307 are arranged between neighboring rows of the first conductive patterns 303, wherein each connecting portion 305 connects two neighboring first conductive patterns 303 arranged in a row, and the first conductive patterns 303 are electrically insulated from the second conductive patterns 307; in step S105, a plurality of insulated protrusions 313 in the touching area 302 and an insulated frame 306 in the peripheral area 304 are formed, wherein each insulated protrusion 313 covers one connecting portion 305; in step S107, a bridging member 327 is formed on each insulated protrusion 313, and the bridging member 327 electrically connects two neighboring second conductive patterns 307.

Figure 6:
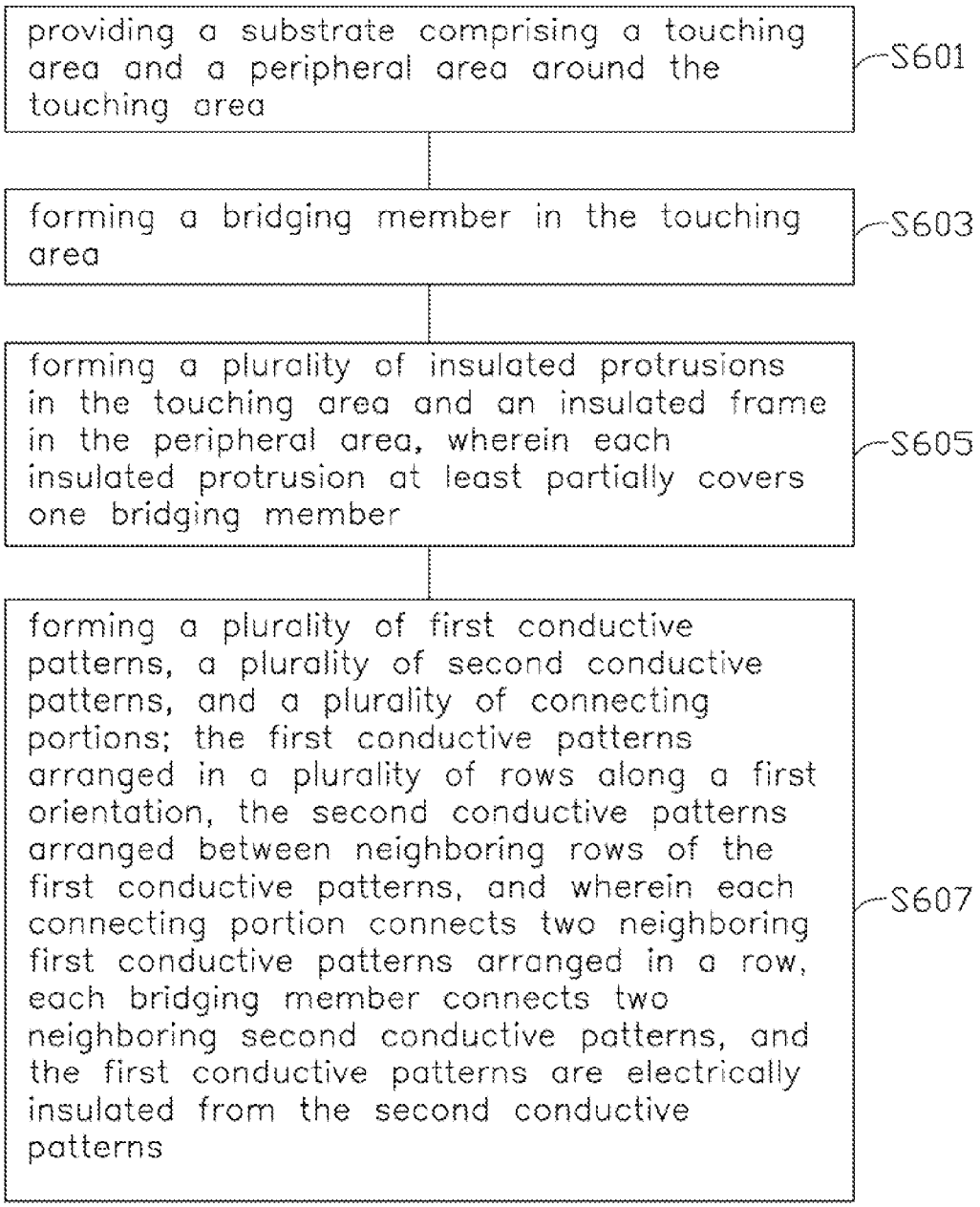
FIGS. 6 through 9 show a second embodiment of a method of fabricating a capacitance touch panel module.
Figure 7:
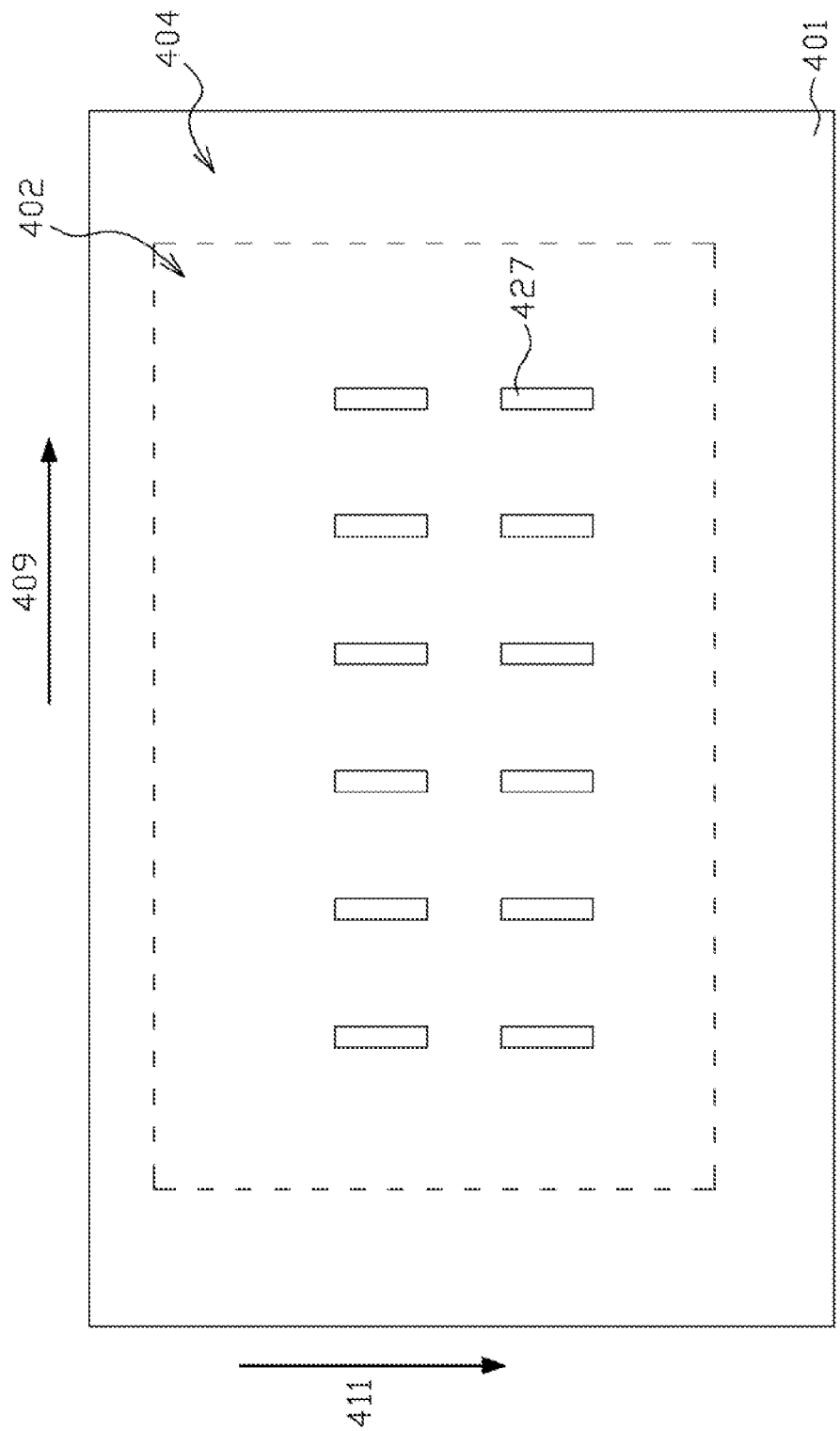

Referring to FIGS. 6 and 7, a second embodiment of a method of fabricating a capacitance touch panel module is described as follows. A substrate 401 with a touching area 402 and a peripheral area 404 arranged around the touching area 402 is provided. A plurality of bridging members 427 is formed in the touching area 402.

Figure 8:
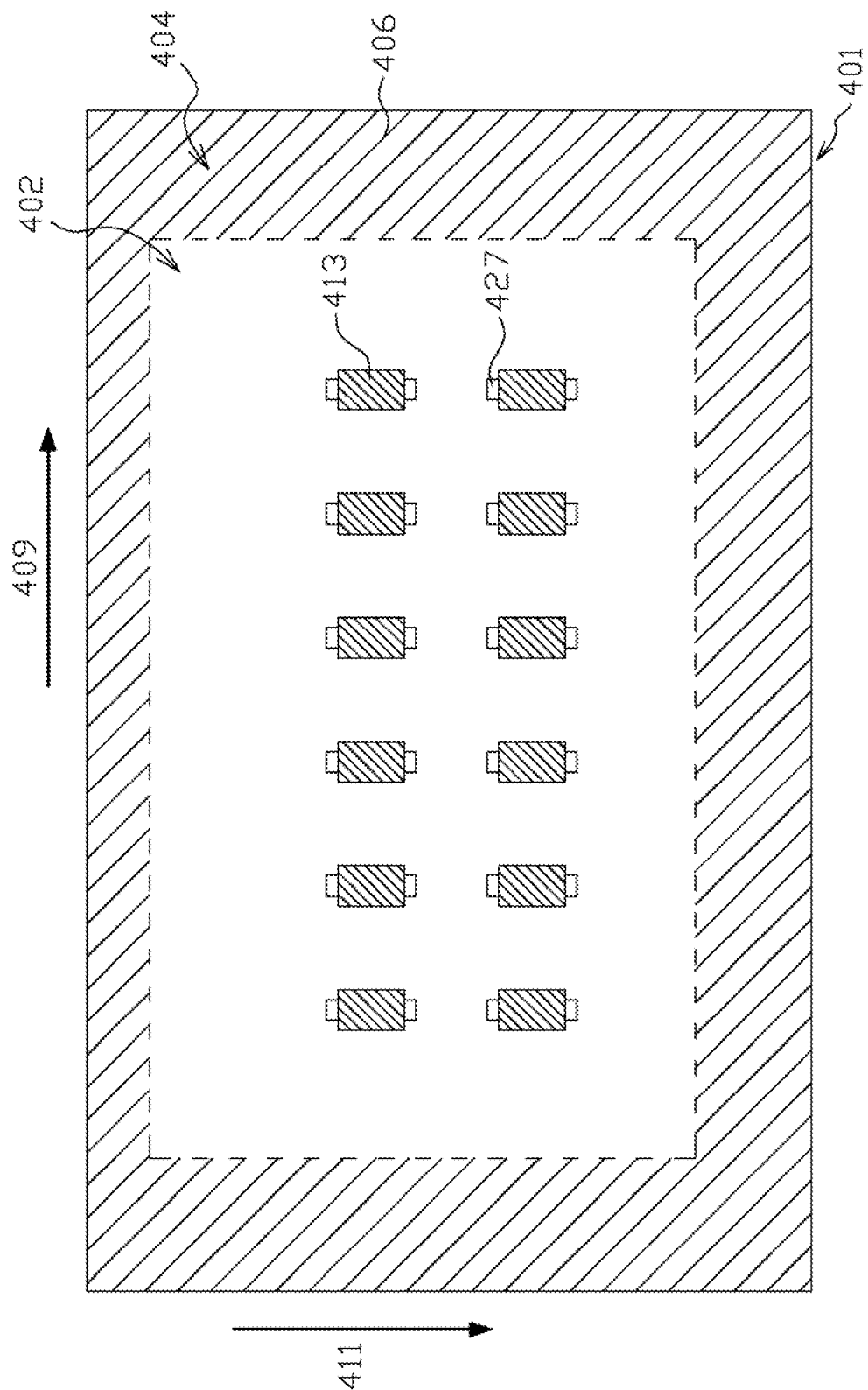

Referring to FIG. 8, a plurality of insulated protrusions 413 is formed in the touching area 402. Each insulated protrusion 413 covers at least part of one bridging member 427. An insulated frame 406 is formed in the peripheral area 404. The insulated protrusions 413 and the insulated frame 406 are formed as disclosed in the first embodiment.

Figure 9:
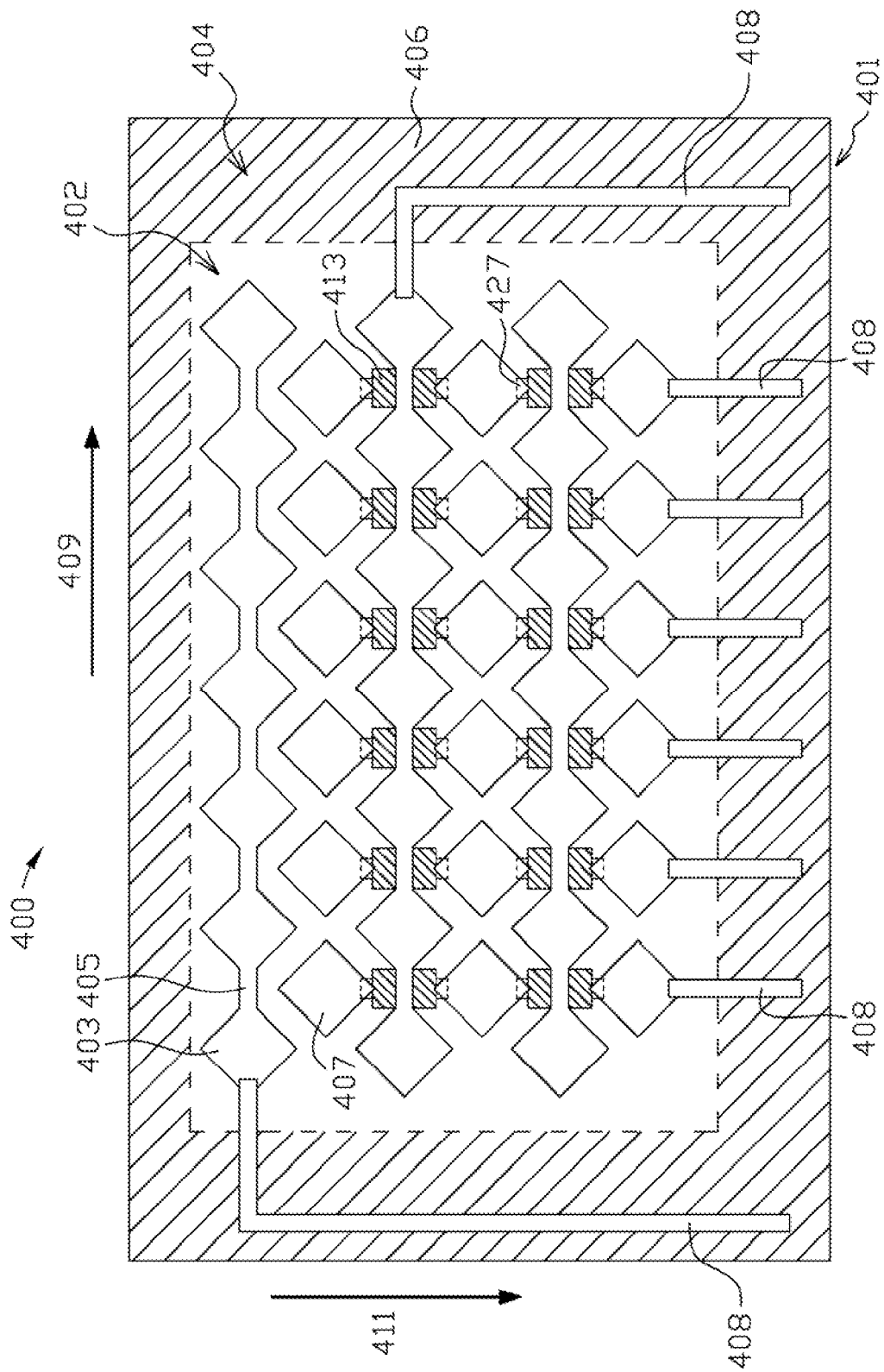

Referring to FIG. 9, a transparent conductive layer (not shown) is formed on the substrate 401, for supporting a plurality of first conductive patterns 403, a plurality of second conductive patterns 407, and a plurality of connecting portions 405 in the touching area 402. The arrangement of the first conductive patterns 403, the second conductive patterns 407, and the connecting portions 405 is substantially the same as that of the first conductive patterns 303, the second conductive patterns 307, and the connecting portions 305 of the first embodiment. Each bridging member 427 connects two second conductive patterns 407, and each connecting portion 405 covers parts of one insulated protrusion 413.

A plurality of conductive wires 408 is formed on the insulated frame 406. Parts of the conductive wires 408 connect with parts of the first conductive patterns 403, respectively. The other parts of the conductive wires 408 connect with parts of the second conductive patterns 407, respectively. Then a protective layer (not shown) is formed on the substrate 401 and covers the entire touching area 402 and the entire peripheral area 404. Thus, a capacitance touch panel module 400 with a higher transmittance is formed.

Referring to FIGS. 6 through 9, the second embodiment of the method of fabricating a capacitance touch panel module is described in the following: in step S601, a substrate 401 comprising a touching area 402 and a peripheral area 404 around the touching area 402 is provided; in step S603, a bridging member 427 is formed in the touching area 402; in step S605, a plurality of insulated protrusions 413 in the touching area 402 and an insulated frame 406 in the peripheral area 404 are formed, wherein each insulated protrusion 413 at least partially covers one bridging member 427; in step S607, a plurality of first conductive patterns 403, a plurality of second conductive patterns 407, and a plurality of connecting portions 405 are formed, in which the first conductive patterns 403 are arranged in a plurality of rows along a first orientation 409, the second conductive patterns 407 are arranged between neighboring rows of the first conductive patterns 403, and wherein each connecting portion 405 connects two neighboring first conductive patterns 403 arranged in a row, each bridging member 427 connects two neighboring second conductive patterns 407, and the first conductive patterns 403 are electrically insulated from the second conductive patterns 407.

The capacitance touch panel modules 300, 400 set the substrate 301, 401 as the touching portion, such that no protective lens is needed in the capacitance touch panel modules 300, 400, which thereby able to provide higher transmittance. The touching structures of the capacitance touch panel modules 300, 400 are formed by lithography or photo etching, such that no optical adhesive is required in the fabrication method.

Finally, while various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. A method of fabricating a capacitance touch panel module, comprising:
   providing a substrate comprising a touching area and a peripheral area around the touching area;
   forming a plurality of first conductive patterns, a plurality of second conductive patterns, and a plurality of connecting portions; wherein the first conductive patterns arranged in a plurality of rows along a first orientation, the second conductive patterns arranged between neighboring rows of the first conductive patterns, wherein each connecting portion connects two neighboring first conductive patterns arranged in a row, and the first conductive patterns are electrically insulated from the second conductive patterns;
   forming a plurality of insulated protrusions in the touching area and an insulated frame in the peripheral area, wherein each insulated protrusion is dome-shaped with a curved surface and covers one connecting portion, wherein the insulated protrusions and the insulated frame are formed by: forming an insulated layer on the substrate; forming a photoresist layer on the insulated layer; developing the photoresist layer; and etching the insulated layer through the developed photoresist layer to form the insulated protrusions and the insulated frame; and
   forming a bridging member on each insulated protrusion, the bridging member electrically connecting two neighboring second conductive patterns.

2. The method of fabricating a capacitance touch panel module of claim 1, wherein the insulated protrusions and the insulated frame are made of light absorbing materials.

3. The method of fabricating a capacitance touch panel module of claim 1, wherein the insulated protrusions and the insulated frame are formed by ink jet printing.

4. The method of fabricating a capacitance touch panel module of claim 1, wherein formation of bridging members further comprises forming a plurality of conductive wires on the insulated frame; wherein parts of the conductive wires connect with the first conductive patterns, and the other parts of the conductive wires connect with the second conductive patterns.

5. The method of fabricating a capacitance touch panel module of claim 1 further comprising forming a protective layer covering the touching area and the peripheral area.

6. A method of fabricating a capacitance touch panel module, comprising:
   providing a substrate comprising a touching area and a peripheral area around the touching area;
   forming a bridging member in the touching area;
   forming a plurality of insulated protrusions in the touching area and an insulated frame in the peripheral area, wherein each insulated protrusion is dome-shaped with a curved surface and at least partially covers one bridging member, wherein the insulated protrusions and the insulated frame are formed by: forming an insulated layer on the substrate; forming a photoresist layer on the insulated layer; developing the photoresist layer; and etching the insulated layer through the developed photoresist layer to form the insulated protrusions and the insulated frame; and
   forming a plurality of first conductive patterns, a plurality of second conductive patterns, and a plurality of connecting portions, wherein the first conductive patterns are arranged in a plurality of rows along a first orientation, the second conductive patterns are arranged between neighboring rows of the first conductive patterns, each connecting portion connects two neighboring first conductive patterns, each bridging member connects two neighboring second conductive patterns, and the first conductive patterns are electrically insulated from the second conductive patterns.

7. The method of fabricating a capacitance touch panel module of claim 6, wherein the insulated protrusions and the insulated frame are made of light absorbing materials.

8. The method of fabricating a capacitance touch panel module of claim 6, wherein the insulated protrusions and the insulated frame are formed by ink jet printing.

9. The method of fabricating a capacitance touch panel module of claim 6 further comprising forming a plurality of conductive wires on the insulated frame, wherein parts of the conductive wires connect the first conductive patterns, and the other parts of the conductive wires connect with the second conductive patterns.

10. The method of fabricating a capacitance touch panel module of claim 6 further comprising forming a protective layer covering the touching area and the peripheral area.

11. A capacitance touch panel module, comprising:
a substrate comprising a touching area and a peripheral area around the touching area;
a contact structure arranged in the touching area comprising a plurality of first conductive patterns arranged in a plurality of rows along a first orientation and a plurality of second conductive patterns arranged between the neighboring rows of the first conductive patterns, the first conductive patterns are electrically insulated from the second conductive patterns;
a plurality of connecting portions, wherein each connecting portion connects two neighboring first conductive patterns arranged in a row;
a plurality of insulated protrusions and a plurality of bridging members in the touching area, wherein each insulated protrusion is dome-shaped with a curved surface and covers one connecting portion, each bridging member covers one insulated protrusion and connects two neighboring second conductive patterns arranged along a second orientation;
an insulated frame arranged in the peripheral area; and
a plurality of conductive wires arranged on the insulated frame, the conductive wires electrically connecting the conductive patterns.

12. The capacitance touch panel module of claim 11, wherein parts of the conductive wires connect with the first conductive patterns, and the other parts of the conductive wires connect with the second conductive patterns.

13. The capacitance touch panel module of claim 11 further comprising a protective layer covering the touching area and the peripheral area.

14. The capacitance touch panel module of claim 11, wherein the insulated protrusions and the insulated frame are made of light absorbing materials.

* * * * *